United States Patent [19]
Storjohann et al.

[11] Patent Number: 5,484,626
[45] Date of Patent: Jan. 16, 1996

[54] METHODS AND APPARATUS FOR MAINTAINING ELECTROLESS PLATING SOLUTIONS

[75] Inventors: Donald E. Storjohann, Northboro; Sven J. Wiberg, Wilmington, both of Mass.

[73] Assignee: Shipley Company L.L.C., Marlborough, Mass.

[21] Appl. No.: 863,806

[22] Filed: Apr. 6, 1992

[51] Int. Cl.$^6$ ............................................. B05D 7/00
[52] U.S. Cl. .......................... 427/8; 427/10; 118/663; 118/665; 118/688; 118/26; 118/404
[58] Field of Search .......................... 427/8, 10; 118/665, 118/688, 663, 26, 404

[56] References Cited

U.S. PATENT DOCUMENTS

| | | | |
|---|---|---|---|
| 3,670,693 | 6/1972 | Rorick | 118/665 |
| 4,061,588 | 12/1977 | Gulla | 427/304 |
| 4,343,827 | 8/1982 | Thompson | 427/10 |
| 4,499,852 | 2/1985 | Castner . | |
| 4,565,575 | 1/1986 | Cardin et al. . | |
| 4,623,554 | 11/1986 | Kaschak et al. . | |
| 4,626,446 | 12/1986 | Capwell et al. . | |
| 4,654,126 | 3/1987 | Amelio et al. . | |
| 4,674,440 | 6/1987 | Cardin | 118/688 |
| 4,707,377 | 11/1987 | Capwell | 427/8 |
| 4,707,378 | 11/1987 | McBride | 427/8 |
| 4,774,101 | 9/1988 | Harris . | |

FOREIGN PATENT DOCUMENTS

| | | |
|---|---|---|
| 0265901 | 10/1987 | European Pat. Off. . |
| 2236855 | 8/1990 | United Kingdom . |
| 9116472 | 10/1991 | WIPO . |

OTHER PUBLICATIONS

R. Schumacher et al "Kinetic Analysis of Electroless Deposition of Copper" J. Phys. Chem. vol. 89, No. 20, 1985, pp. 4338–4342.

W. Hinsberg, et al., *Rev. Sci, Instrum.* 60(3) 489–492. (1989).

R. Schumacher, *Angew. Chem. Int. Ed. Engl.*, vol. 29, No. 4, 329–343, (1990).

J. Thomas, *J. Electrochem. Soc.: Electrochemical Science and Technology*, 677–680, (1977).

*Primary Examiner*—Shrive Beck
*Assistant Examiner*—David Maiorana
*Attorney, Agent, or Firm*—Robert L. Goldberg

[57] ABSTRACT

Methods and apparatus for controlling plating rates of electroless plating solutions. The invention provides for continuous monitoring and replenishment of a one or more components of an electroless plating solution on a real time basis. The invention can be characterized in part by use of a quartz crystal microbalance.

13 Claims, 4 Drawing Sheets

METHODS AND APPARATUS FOR MAINTAINING ELECTROLESS PLATING SOLUTIONS

BACKGROUND OF THE INVENTION

1. Field of the Invention

The present invention relates to methods for controlling the composition and deposition rate of an electroless plating solution and to control apparatus therefor.

2. Background Art

Electroless plating solutions including electroless copper solutions are used in a wide range of industrial applications. In particular, electronic printed circuit boards are often manufactured by electroless deposition of copper on the board's circuit traces and through holes walls.

A typical electroless copper solution comprises a number of components including a cupric salt, a chelating or complexing agent such as ethylenediaminetetracetic acid (EDTA), a reducing agent such as formaldehyde and a caustic pH adjustor such as sodium hydroxide. Proprietary additives also are typically employed in relatively low concentrations to enhance various characteristics of the copper plate. Additionally, if the surface to be plated is not catalytic for electroless deposition, the substrate surface is treated with a catalyst prior to contact with the electroless plating solution. A suitable catalyst for electroless deposition is a palladium tin colloid catalyst, as disclosed for example in U.S. Pat. Nos. 4,061,588 and 3,011,920, incorporated herein by reference.

It is recognized that to provide a quality electroless deposit, the rate of metal deposition on a substrate should be maintained substantially constant. It is known that various plating bath components are continuously depleted during use of a plating solution, for example by plate-out or chemical reaction, and that concentration variations of bath components can vary the metal deposition rate.

Prior approaches for controlling the rate of copper deposition have included monitoring and controlling temperature, pH and chemical composition of the plating solution. For example, one approach provides for manual analysis of the plating solution during use of same followed by manual addition of plating bath components as shown to be necessary by analysis. Such manual analysis is often performed using "rate coupons". At intervals of approximately one hour, a determination of plating rate is made by measuring the weight gain of a copper coupon that has been suspended in the plating solution for said interval. The weight gain measurement on the copper coupon serves as a basis to add additional component(s), e.g. formaldehyde, to the plating bath and thereby control the copper deposition rate. A notable shortcoming of a rate coupon analysis is that it yields little information about the current plating rate. Consequently, the plating rate of a bath may vary widely and for extended periods before any attempts are made to return the plating rate to a desired level. It thus would be desirable to have a means to continuously and accurately monitor and maintain the deposition rate of a plating solution.

Relatively recently, a technique based on the use of an oscillating quartz crystal has been reported for use in determining mass change. This mass measurement method is often referred to as a quartz crystal microbalance or QCM. See R. Schumacher, *Angewendte Chemie Int. Ed. Engl.*, vol. 29, no. 4, 329–343 (1990); W. Hinsberg, et al., *Rev. Sci. Instrum.*, 60 (3), 489–492 (Mar. 1989), both incorporated herein by reference for their teaching of quartz microbalances and use of the same.

SUMMARY OF THE INVENTION

The present invention comprises methods for controlling the concentration of chemical components of an electroless plating solution, and methods for controlling the deposition rate of an electroless plating solution. The invention employs a quartz crystal microbalance to monitor a plating solution deposition rate on a real time basis. A control voltage is derived from the quartz crystal microbalance and serves to control the replenishment rate of at least one component of the electroless plating solution. For example, in a preferred embodiment of the invention, the solution component to be controlled is formaldehyde. A preferred process of the invention comprises steps of determining the plating rate of the plating solution, said determining step comprising use of a quartz crystal microbalance; and continuously maintaining the plating rate at a desired value.

It has been found that the invention enables maintaining highly constant plating rates for extended periods of time and has particular utility in full-build additive plating processes where e.g. a plating cycle of eighteen hours or greater is employed to produce circuit traces on a printed circuit board.

The apparatus of the invention in general comprises a quartz crystal microbalance in communication with a plating solution, and means responsive to the quartz crystal microbalance for replenishing one or more components of the plating solution. The quartz crystal microbalance can provide an input of the amount of plating metal deposited to an additive controller unit that comprises a microcomputer. The controller unit in turn regulates the rate of replenishment of one or more components of the plating solution in order to continuously maintain the plating rate of the solution at a specific value. Preferably the apparatus further comprises analysis units such as a colorimeter and titrator that provide inputs to the controller unit of the concentrations of one or more plating solution components. The controller unit in turn regulates the rate of replenishment of said component(s) to, for example, maintain the concentration of the component(s) substantially constant throughout a plating cycle. Replenishment of the plating solution is suitably accomplished by continuous outputs throughout a plating process from the controller unit to one or more replenishment pumps. The pumps supply plating bath components to the plating solution and suitably cycle on and off in response to shifts away from desired plating rates and bath component concentrations.

As used herein, the term "quartz crystal microbalance" includes any analysis apparatus that comprises a quartz crystal microbalance or oscillator.

DETAILED DESCRIPTION OF THE INVENTION

Figure 1:
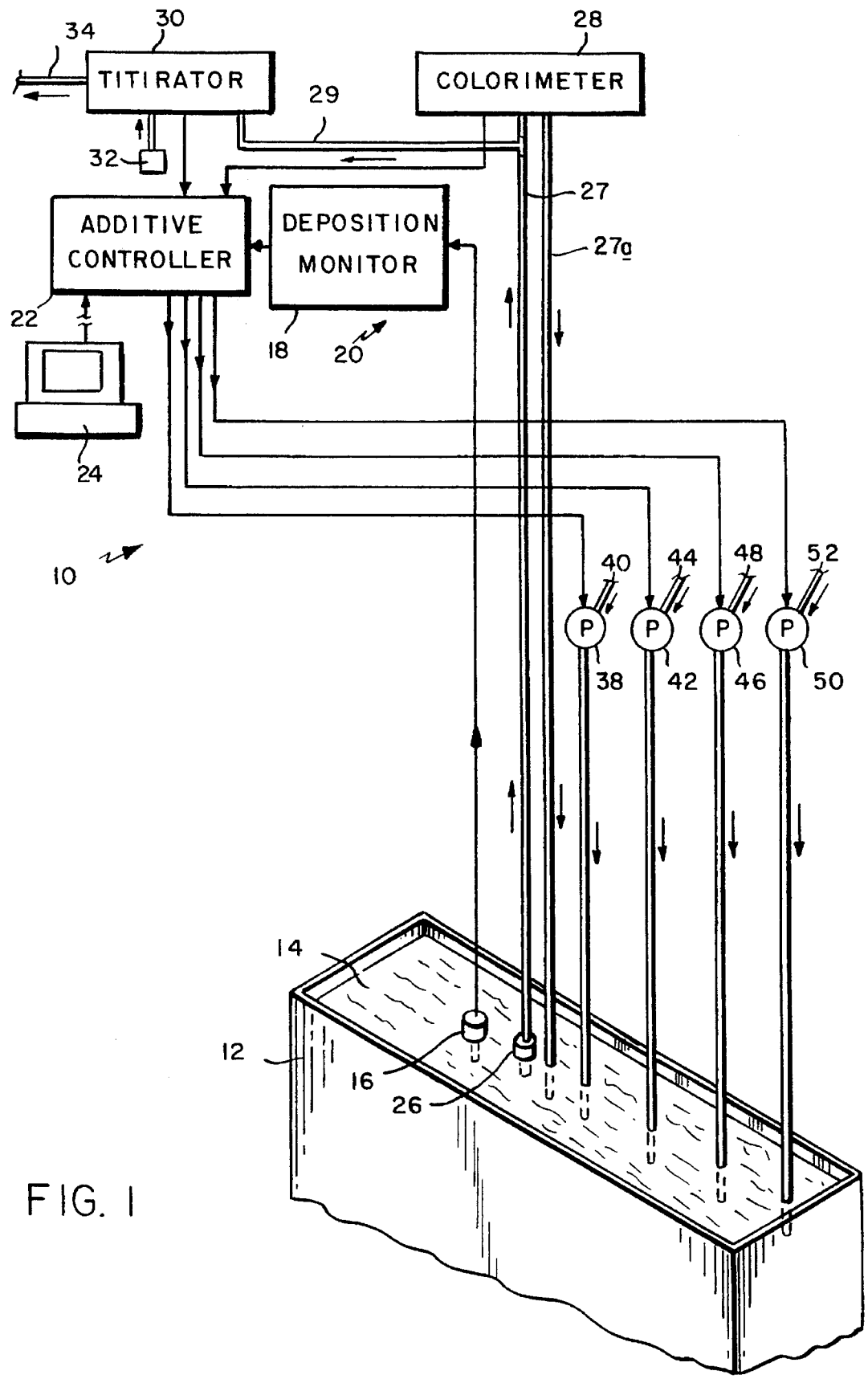
FIG. 1 is a schematic diagram of an apparatus of the present invention.

Referring to the Drawings, FIG. 1 shows one embodiment of the invention wherein plating control system 10 comprises plating tank 12 that holds electroless plating solution 14. In FIG. 1, fluid flow is shown by double lines with arrows proximate thereto indicating the direction of fluid flow; and electronic coupling for passage of electronic signals are shown by single lines with arrows directly on said single lines indicating the direction of transmission of electronic outputs. Communicating with solution 14 is a quartz crystal microbalance probe or sensor 16 in electrical connection with deposition monitor 18. Probe 16 and deposition monitor 18 together comprise quartz crystal microbalance (sometimes referred to herein as QCM) unit 20. Suitable QCM units are commercially available, for example, the Plating Rate and Thickness Monitor, Model PM-500, available from Maxtek, Inc. (Torrance, Calif.), or other similar apparatus available from other vendors. The QCM unit is appropriately modified so that QCM 20 can communicate the plating rate occurring in tank 12 to additive controller 22. Preferably deposition monitor 18 includes a graphical or digital display of plating rate occurring in the plating solution 14. A suitable probe 16, such as the above noted unit available from Maxtek, comprises a thin quartz crystal as a transducing element. In use, the quartz crystal is excited into mechanical motion by an oscillator positioned within probe 16. Prior to metal deposition, the crystal element vibrates at a known frequency, for example 5 MHz; this vibrational frequency is lowered in direct proportion to the mass of metal deposited on the surface of the quartz crystal element. After plating approximately one mil (25 micrometers) of metallic deposit on the electrode, the vibration frequency of the quartz crystal will approach 4 MHz and accuracy of deposition measurements can be compromised. It is thus generally preferable to remove the metal plate at such time rather than continuing to monitor the plating sequence with the thickly coated crystal element. Stripping of the metal plate from the crystal element is preferably carried out under the mildest conditions available for the particular metal deposit and with the probe unit and crystal at room temperature. For removal of nickel deposits from an electroless nickel plating solution, the crystal element surface is suitably treated with a few drops of an aqueous nitric acid (50% volume) solution. For removal of copper deposits, the crystal element surface is suitably treated with several drops of an aqueous persulfate solution.

QCM 20 is in electrical connection with additive controller 22 and, during the course of a plating cycle, continuously provides an input signal to controller 22 representing the amount of metal being deposited in the plating bath. Controller 22 suitably comprises a 2 inch by four inch single board computer such as a TDS 9092 8 bit microcomputer (available from Triangle Digital Services, London, U.K.) programmed in Forth. This single board computer is then mounted on a secondary, larger circuit board. As is recognized by those in the art, the secondary circuit board provides communication means between external apparatus and the single board computer of controller 22. Controller 22 also may suitably be a standard IBM Personal Computer or other similar device. Optionally, controller 22 can communicate with and be controlled by another computer 24, e.g. a standard IBM Personal Computer, so that system 10 may be monitored and regulated from a remote site.

QCM 20 provides an analysis of the metal deposition rate of plating solution 14 in tank 12. As noted above, QCM 20 continuously communicates the plating deposition rate occurring in tank 12 to controller 22. If the plating rate input from QCM 20 to controller 22 deviates from a targeted deposition rate previously entered into controller 22 by an operator, controller 22 will generate a signal to modify or commence the addition of one or more components to bath 14 to thereby provide a plating rate of a desired value. For example, in a preferred system, controller 22 continually receives input from QCM 20 and, based on said input, provides an output to maintain or modify the rate of formaldehyde replenishment. That is, automatic continuous control of the plating rate in tank 12 is provided by QCM 20 and controller 22 continually monitoring and, if necessary, adjusting the formaldehyde replenishment rate to plating solution 14 immediately upon QCM input to controller 22. By maintaining the plating rate at a constant selected level established by a value entered into controller 22, it is possible to provide a high quality metal deposit, particularly in extended plating process such as additive copper plating. It should be appreciated that a number of variations of this described system will be suitable. For example, based on inputs from QCM 20, controller 22 can provide outputs to continually maintain or modify the replenishment rate of a plating bath component other than formaldehyde (e.g., caustic), or controller 22 can provide outputs to continually maintain or modify the replenishment rate of more than one plating solution component.

Preferably other components of the plating solution are continuously or periodically added to the plating bath to maintain their concentration substantially constant during a plating cycle. Thus, the plating control system of the invention suitably can comprise other analysis units in addition to QCM 20. For example, analysis units such as a colorimetric cell and a titrator may be employed in the plating control system to determine and maintain concentrations of one or more plating bath components.

More specifically, a suitable system is shown in FIG. 1 where probe 26 extracts solution 14 from tank 12 and passes the solution through line 27 to colorimeter 28. Colorimeter 28 measures metal concentration, e.g. copper or nickel concentrations, of the plating solution cycled therethrough. A suitable colorimeter comprises two fiber optic elements within a flow chamber of colorimeter 28. Plating solution 14 flows into colorimeter 28 where the solution passes between the two fiber optic elements. Light is passed through one of the fiber optic elements, into the opposing fiber optic element and then to a photovoltaic cell which provides an inverse voltage reading. This voltage reading is calibrated to copper concentration and variations in the intensity of light passing through the plating solution. The voltage reading thus can be used to determine plating metal concentration and replenishment requirements. A suitable light source for the colorimeter is a 10 watt quartz halogen lamp. Colorimeters are described in U.S. Pat. Nos. 4,565,575 and 4,774,101, both said patents incorporated by reference herein.

Colorimeter 28 is electrically connected to controller 22 and, during the course of a plating cycle, continuously provides an input thereto indicative of the metal concentration of plating solution flowing through the unit. Upon variation of the input to controller 22 from a metal concentration value previously entered into controller 22 by an operator, controller 22 will generate an output that will activate or modify the addition of a metal containing solution to tank 12.

Following metal concentration determination in colorimeter 28, the sample of plating solution suitably flows from colorimeter 28 through line 27a and is returned to tank 12. An alternative approach provides for flow of the plating sample or a portion thereof directly to titrator 30 from colorimeter 28 through a solution flow line (not shown).

Titrator 30 suitably determines the concentration of one or more components of the plating solution. In use, probe 26 removes solution 14 from tank 12 and said removed plating solution passes through line 27 into line 29 and then to titrator 30. Alternatively and as discussed above, a sample of plating solution may flow from colorimeter 28 to titrator 30.

Titrator 30 is suitably employed to measure the pH of the plating solution and thereby determine the concentration of a plating solution component. A suitable titrating reagent for a caustic component such as NaOH is a 0.1N aqueous HCl solution supplied to titrator 30 from vessel 32. Such an acid solution can react with the caustic plating bath component, thereby decreasing the pH of the plating solution sample. Titrator 30 also can be employed to determine the concentration of a formaldehyde or formaldehyde derivative component of the plating solution. A suitable reactant for titration of a formaldehyde bath component is a sodium sulfite solution. A sodium sulfite solution can react with the formaldehyde component to produce hydroxide ions. The hydroxide ions can then be titrated with an acid such as a 0.1N aqueous HCl solution as described above. Suitable titrator units are commercially available, for example an Ionics Auto Titrator available from Ionics, Inc. of Watertown, Mass. Titrators and the use thereof are also described in the above incorporated patents. After analysis of the plating solution sample in titrator 30, the solution sample can be discharged through line 34 to a waste receptacle.

Titrator 30 is electrically connected to controller 22 and, during the course of a plating cycle, continuously provides an input thereto indicative of the pH of the plating solution sample. Upon variation of the input from titrator 30 to controller 22 from a pH value previously entered into controlled 22 by an operator, controller 22 will generate an output that will activate or modify the flow of a plating bath component to plating solution 14 in tank 12. For example, in the case where titrator is used to determine concentration of the caustic component of a plating sample, the pH value obtained from acid titration is correlated with the caustic content and variation of the pH from a preset point will generate an output from controller 22 to activate or modify addition of caustic to bath 14. Similarly, in the case of titration for formaldehyde concentration, the pH value obtained from sulfite titration is correlated with the formaldehyde concentration and variation of the pH from a preset value will generate an output from controller 22 to activate or modify the addition of formaldehyde to bath 14.

One or more peristaltic pumps (not shown) suitably provide means for flow of samples of plating solution 14 to colorimeter 28 and titrator 30. Pump head sizes are selected to obtain desired flow rates for the solution being driven by the pump. Suitable peristaltic pumps are commercially available such as the pump sold under the trade name Masterflex by Cole Parmer Instrument Co., Chicago, Ill.

As depicted in FIG. 1, controller 22 is in electrical communication with one or more replenishment pumps. These pumps provide means of supplying solutions of plating bath components to bath 14. FIG. 1 shows controller 22 communicating with replenishment pumps 38, 42, 46 and 50 by means of the respective electrical connection lines. It should be clear that less than or greater than four pumps may be suitably employed in system 10. For example, additional replenishment pumps can be used to supply various additives known in the art which are used in relatively low concentrations to enhance various physical characteristics of the metal deposit. Alternatively, such additives may be a component of another replenishment solution.

The various plating solution flow lines used in system 10 (e.g., lines 27, 27a, 29, 34 and those lines providing fluid communication between the replenishment pumps and tank 12) are suitably polymer tubing such as polypropylene tubing. If over time metal deposits on the tubing, the tubing can be replaced.

In operation of system 10, controller 22 provides an output to a replenishment pump. Based on such output, the pump draws a controlled volume of a particular replenishment solution from a reservoir and flows said controlled volume to plating solution 14 in tank 12 through an outlet. In FIG. 1, various reservoirs of replenishment solutions are depicted as 40, 44, 48 and 52 for each of the corresponding replenishment pumps. Solution flow lines provide communication of the particular replenisher solution to plating solution 14. Suitable replenishment pumps are commercially available. A solenoid or motor driven diaphragm metering pump is generally preferred. Specifically preferred are the electronically and solenoid driven diaphragm-type pumps (Gama 4 series) available from ProMinent, Inc. of Pittsburgh, Pa.

In one preferred embodiment of the invention where an electroless copper plating bath is being controlled, QCM 20 provides an input signal to controller 22 representing the plating rate of solution 14 in tank 12. If this input is different than a preset value, controller 22 sends a control signal to replenishment pump 38 which pumps an amount of formaldehyde (or modifies the amount of formaldehyde being pumped) from formaldehyde solution reservoir 40 as indicated by controller 22 to be necessary to maintain the plating rate at a desired value. Similarly, colorimeter provides an input to controller 22 of the copper concentration of the bath sample passing therethrough. If this input is different than a preset value, controller 22 then sends a control signal to replenishment pump 42 which pumps an amount of copper solution (or modifies the amount of copper solution being pumped) from copper solution reservoir 44 as indicated by controller 22 to be necessary to maintain the copper concentration at a desired level. Titrator 30 provides an input to controller 22 of the hydroxide concentration of the bath sample passing therethrough. If this input is different than a preset value, controller 22 then sends a control signal to replenishment pump 46 which pumps an amount of hydroxide solution (or modifies the amount of hydroxide solution being pumped) from hydroxide solution reservoir 48 as indicated by controller 22 to be necessary to maintain the caustic concentration at a desired level. Replenishment pump 50 is suitably used to replenish other component(s) of plating solution 14 via command of controller 22.

Figure 2A:
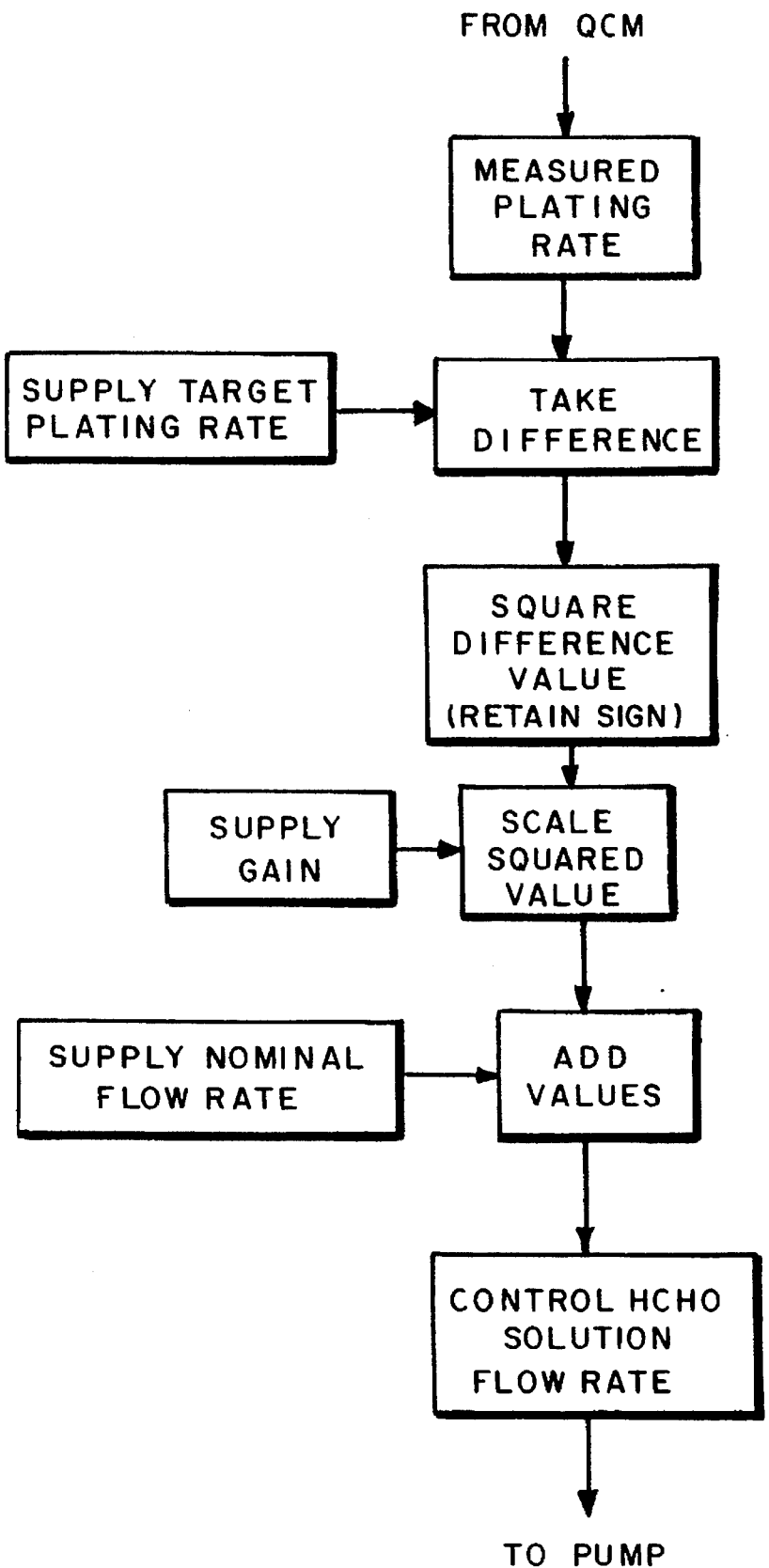
FIGS. 2A, 2B and 2C illustrate suitable programming steps of additive controller unit 22 of the present invention.
Figure 2B:
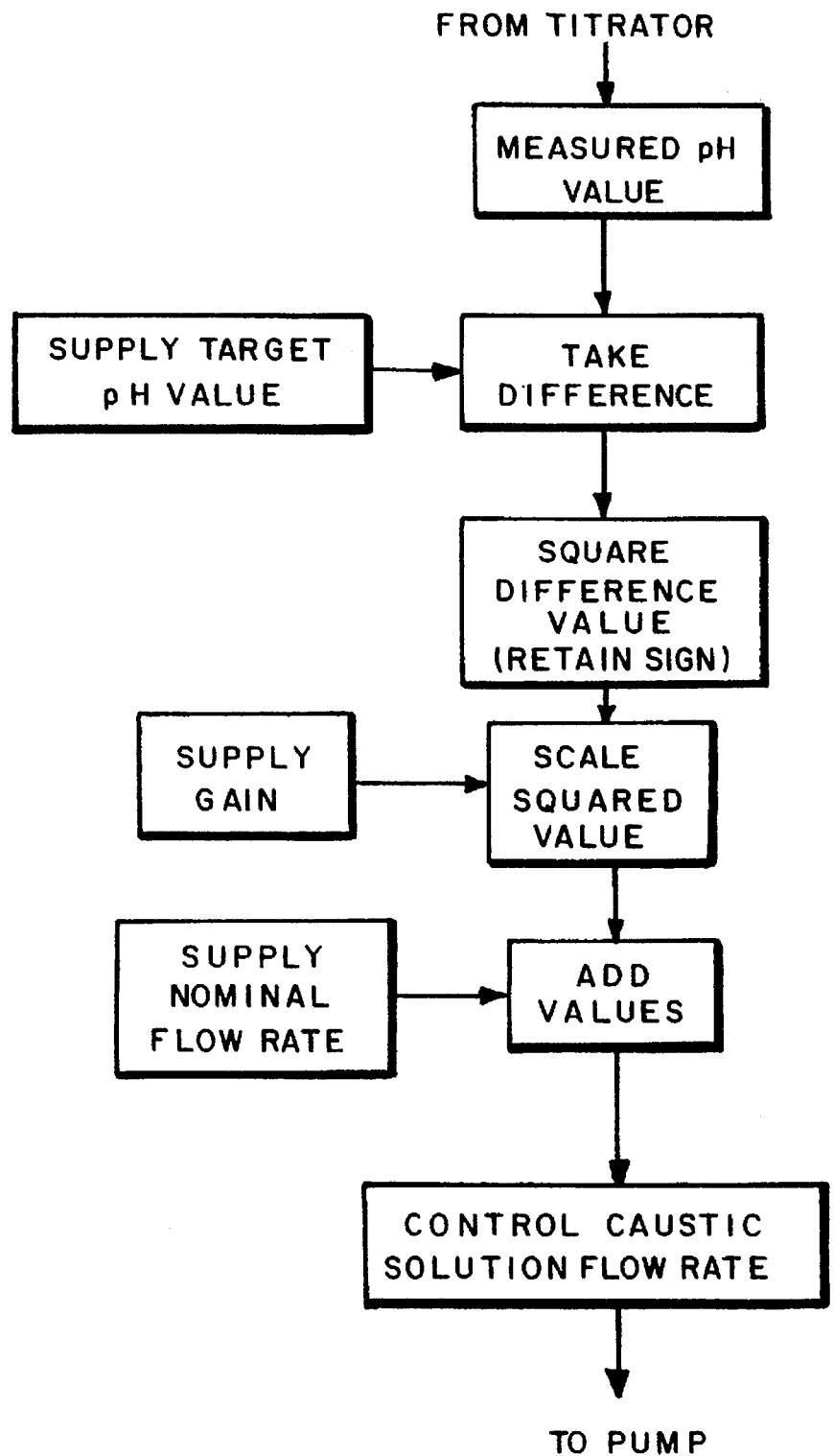
Figure 2C:
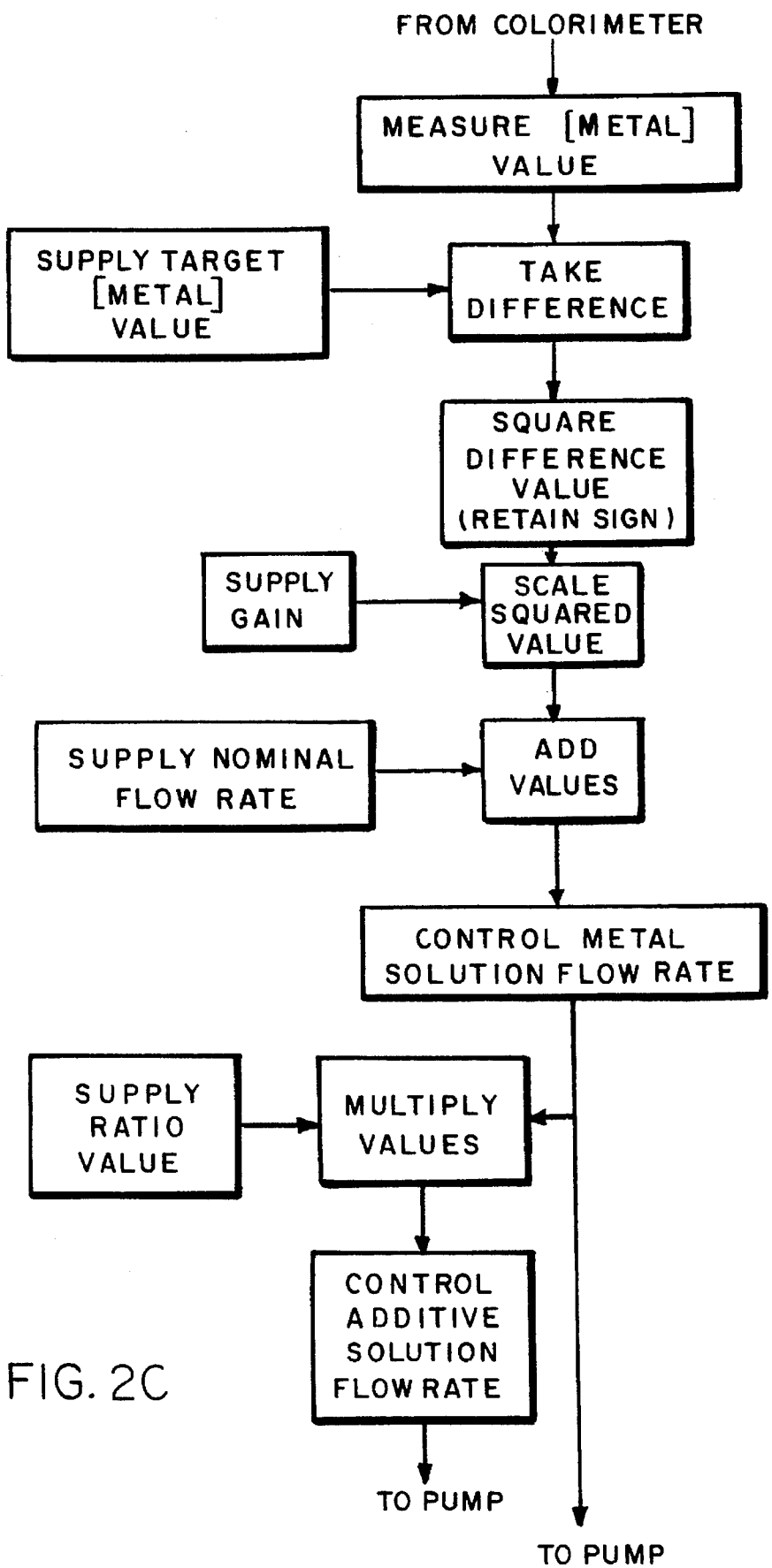

The operation of a suitable program for use in controller 22 is depicted in FIGS. 2A through 2C. FIG. 2A illustrates suitable programming steps for deriving a formaldehyde replenishment control signal. QCM 20 continually provides inputs of measured metal deposition rate values to controller 22. The difference between the measured value and an operator set target plating rate value is determined. The difference value is then squared with the sign of the difference value, i.e. positive or negative, being retained in the squaring operation. The square is then scaled in accordance with an operator set gain. The resulting product is then added to an operator set nominal flow rate. This sum represents the desired control formaldehyde flow rate which is then supplied to a formaldehyde replenishment pump to control the flow rate therefrom. FIGS. 2B and 2C illustrate similar programming steps for deriving caustic and plating metal replenishment control signals, respectively, that are supplied to other replenishment pumps to control the flow rates therefrom.

The control flow rate for a replenishment solution can serve to control the addition of other plating solution components. For example, as shown in FIG. 2C, the control metal solution flow rate is multiplied by a preset value (i.e., the "ratio value" as shown in FIG. 2C) to provide a control flow rate for another component of plating solution 14. In preferred aspects of the invention, the control metal solution flow ratio is multiplied by a preset ratio value to provide a control flow rate of a replenishment solution of a complexing agent such as EDTA.

An operator of system 10 sets the target plating rate, pH value and metal concentration (i.e., [metal]) values, the gain values and nominal flow rate values as shown in FIGS. 2A–2C. These values can be communicated to controller 22 via a keyboard or other input means in electrical communication with controller 22. As discussed, the values can be entered from a remote site if desired, for example, by computer 24.

The nominal flow rates entered into computer 22 are typically selected based on empirical data to provide expected replenishment needs of a particular plating solution. As is known in the art, an electroless plating solution requires a more or less continuous flow of chemistry during the course of a plating cycle to replenish solution components being consumed or removed from the solution. Suitable gain values may vary with the particular plating process.

During operation of system 10, plating rate and component concentration values are typically maintained substantially constant for the duration of a plating process to provide enhanced physical properties of the metal plate.

It has been found that the system of the invention enables maintaining a highly constant plating rate for extended periods of time, including plating rates of within about 3 microinches/hr. of a desired value for a continuous plating process of 36 hours or greater in duration. The ability to continuously maintain a plating rate with such precision and for such extended periods is highly advantageous in many processes, for example in the case of full-build electroless copper baths which can have a plating cycle of from 18–24 hours, depending on the desired thickness of the copper deposit. Further, once a plating rate level and bath component concentrations have been entered into controller 22, a plating cycle can be run for extended periods of time unattended by an operator.

By way of example, the apparatus of the invention may be used to control the concentration of components within a plating solution for plating substrates such as a circuit board base material (e.g., an epoxy laminate substrate) wherein the plating solution is an aqueous electroless copper plating solution comprising copper sulfate, a complexing agent such as EDTA, a caustic source such as sodium hydroxide and a reducing agent such as formaldehyde or a formaldehyde derivative such as paraformaldehyde. It is to be understood, however, that while monitoring of this particular solution is a preferred aspect of the invention it is exemplary only and in no way limiting since the apparatus and methods of the invention may be used for controlling the concentration and plating rates of other solutions and components thereof. For example, it is believed that deposition rates of nickel electroless plating baths can be monitored by the system of the present invention. More particularly, the QCM unit can monitor nickel plating rates and control replenishment of one or more bath components; the colorimeter generally can be as effective for monitoring nickel content as copper content; and hypophosphite concentration (hypophosphite being a typical component of electroless nickel baths) can be determined using known methods of titration and ingestion.

The system depicted in FIG. 1 is suitably employed in a plating process as follows. The process typically begins with a freshly prepared electroless copper plating solution prior to the introduction of any work pieces into the plating bath, but after the plating solution has been allowed to reach equilibrium—generally within a few minutes of make-up. Suitable work pieces include a multilayer printed circuit board substrate, the general manufacturing processes of which is known and described for example in Coombs, *Printed Circuits Handbook*, McGraw Hill (3d ed., 1988), incorporated herein by reference.

To initiate monitoring and control of plating in accordance with the invention, plating solution 14 is continuously withdrawn from tank 12 via line 27 to colorimeter 28 for determination of metal content, and through line 29 to titrator 30 for determination of the pH and hence determination of the formaldehyde or hydroxide content. After analysis of the plating solution at titrator 30, the solution sample is suitably withdrawn from system 10 via line 34 to a waste receptacle. Typically a relatively limited amount of solution 14 is withdrawn from tank 12 for analysis by units 28 and 30. For example, flow rates of samples of plating solution 14 to colorimeter 28 through line 27 of from about 50 to 200 ml/minute are suitable; and flow rates of samples of solution 14 to titrator 30 through line 29 at rates of from about 2 to 20 ml/minute are suitable.

Plating rate monitor 18, colorimeter 28 and titrator 30 all communicate and transmit inputs to controller 22. Controller 22 communicates with pumps 38, 42, 46 and 50. As discussed above, outputs from controller 22 regulates the flow of replenishment solutions from solution vessels 40, 44, 48 and 52 through said pumps and into the plating solution 14. Suitable flow rates of replenishment solutions to tank 12 can vary somewhat widely with common flow rates being from about 2 mL of replenisher solution per liter of plating solution per hour to 6 mL/L/hour.

The temperature of the plating solution can be monitored during a plating sequence by apparatus known in the art.

The following non-limiting examples are illustrative of the invention.

EXAMPLE 1

An analysis system according to the invention was constructed and employed as follows. A plating vessel was charged with a copper electroless plating bath comprising 350 mL of an aqueous copper sulfate solution (having a concentration of 3.05 g/l of copper sulfate pentahydrate), 250 mL of an aqueous formaldehyde solution (having a concentration of 1.85 g/l of formaldehyde), an aqueous sodium hydroxide solution to provide a pH of the plating solution of about 12.5 and proprietary additives in relatively low concentrations. The plating bath was heated to 160° F. Copper laminate circuit boards having through holes were then loaded into the heated plating solution. The probe of a QCM unit was also placed in the heated plating solution. The QCM was a Model PM-500 Rate Plating Monitor available from Maxtek, Inc. The QCM unit was in communication with an additive control unit that comprised a TDS 9092 single board computer on secondary circuit board. A colorimetric cell for determining copper concentration, and an Ionics Auto Titrator for determining hydroxide concentration, were also in electrical communication with the additive control unit. The colorimetric cell and Inonics titrator received and analyzed plating solution samples as generally described above and depicted in FIG. 1. The initial reading of the plating bath deposition rate was 90 microinches/hr. The copper deposition rate was maintained at 90±1 microinches for four hours by automatic replenishment via the controller unit communicating with ProMinent metered replenishment pumps as described above and depicted in FIG. 1. After this four hour period, the bath temperature was decreased from 160° C. to 155° C. The deposition rate decreased during cool down of the plating bath, but within 16 minutes after the temperature of the bath was initially decreased the copper deposition rate was again stable at 90 microinches/hr.

EXAMPLE 2

An apparatus of the invention was constructed and operated as generally described in Example 1 above, except copper plating and automatic replenishment of the plating solution was carried out continuously for approximately 36 hours. A preset rate of electroless deposition of copper of 80±3 microinches/hr was maintained throughout the 36 hour plating cycle.

The foregoing description of the invention is merely illustrative thereof, and it should be understood that variations and modifications can be effected without departing from the scope or spirit of the invention as set forth in the following claims.

What is claimed is:

1. A process for maintaining the plating rate of an electroless plating solution essentially constant, said process comprising the steps of:

providing an electroless plating solution and operating said plating solution at a desired plating rate, monitoring the plating rate of said plating solution by means of plating metal from said plating solution onto the quartz crystal element of a quartz crystal microbalance, the quartz crystal microbalance providing an input representing the plating rate to a computer, and supplying an output from the computer to maintain the plating rate at a desired essentially constant value by controlling the addition of at least one plating solution component to the plating solution.

2. The process of claim 1 where the plating rate of the solution is monitored continuously during plating of a substrate and the microbalance continuously provides an input to the computer during the plating of the substrate.

3. The process of claim 2 where the plating solution is a full-build electroless copper bath.

4. The process of claim 2 where the substrate is plated continuously for at least four hours.

5. The process of claim 3 where the substrate is plated continuously for at least eighteen hours.

6. The process of claim 1 further comprising monitoring the plating metal concentration of the plating solution by flowing samples of the solution through a colorimetric cell, providing an output from the colorimetric cell representing the metal concentration to the computer, and supplying an output from the computer for maintaining the metal concentration of the plating solution at a desired value by controlling the addition of a source of the plating metal to the plating solution.

7. The process of claim 6 where the plating rate of the solution is monitored continuously during plating of a substrate and the colorimetric cell continuously an output to the computer during the plating cycle.

8. The process of claim 1 further comprising monitoring the pH of the the plating solution by flowing samples of the solution through a pH analysis apparatus, the analysis apparatus providing to the computer an output representing the solution sample pH, and supplying an output from the computer for maintaining the pH of the plating solution at a desired value by controlling the addition of a one or more plating solution components to the plating solution.

9. The process of claim 8 where the pH of the solution is monitored continuously during plating of a substrate and the analysis apparatus continuously provides an output to the computer during the plating of the substrate.

10. A system suitable for monitoring the plating rate of an electroless plating solution, comprising:

a volume of an electroless plating solution, a quartz crystal microbalance in communication with said plating solution; and means responsive to said quartz crystal microbalance for replenishing one or more components of the plating solution.

11. The system of claim 10 where the means for replenishing the one or more components of the plating solution comprises a computer, the quartz crystal microbalance being in communication with the computer.

12. The process of claim 3 where the component added to the plating solution to maintain plating rate is formaldehyde.

13. The process of claim 3 where the component added to the plating solution to maintain plating rate is a hydroxide.

* * * * *